United States Patent

Kamp

[19]

[11] Patent Number: 6,147,895
[45] Date of Patent: Nov. 14, 2000

[54] FERROELECTRIC MEMORY WITH TWO FERROELECTRIC CAPACITORS IN MEMORY CELL AND METHOD OF OPERATING SAME

[75] Inventor: David A. Kamp, Monument, Colo.

[73] Assignee: Celis Semiconductor Corporation, Colorado Springs, Colo.

[21] Appl. No.: 09/326,413

[22] Filed: Jun. 4, 1999

[51] Int. Cl.[7] ................................................. G11C 11/22
[52] U.S. Cl. .......................... 365/145; 365/149; 365/65; 365/117
[58] Field of Search ................................... 365/205, 145, 365/149, 65, 117, 189.01

[56] References Cited

U.S. PATENT DOCUMENTS

| 2,876,436 | 3/1959 | Anderson . | |
|---|---|---|---|
| 4,873,664 | 10/1989 | Eaton, Jr. . | |
| 4,888,733 | 12/1989 | Mobley . | |
| 5,029,128 | 7/1991 | Toda . | |
| 5,381,364 | 1/1995 | Chern et al. | 365/145 |
| 5,406,510 | 4/1995 | Mihara et al. . | |
| 5,424,975 | 6/1995 | Lowrey et al. | 365/145 |
| 5,615,145 | 3/1997 | Takeuchi et al. | 365/145 |
| 5,617,349 | 4/1997 | Koike | 365/145 |
| 5,694,353 | 12/1997 | Koike | 365/145 |
| 5,798,964 | 8/1998 | Shimizu et al. | 365/145 |
| 5,917,746 | 6/1999 | Seyyedy | 365/145 |
| 5,991,188 | 11/1999 | Chung et al. | 365/145 |
| 5,995,407 | 11/1999 | Kamp | 365/145 |
| 6,034,884 | 3/2000 | Jung | 365/145 |

OTHER PUBLICATIONS

Koike et al., "A 60–ns 1–Mb Nonvolatile Ferroelectric Memory with a Nondriven Cell Plate Line Write/Read Scheme," IEEE Journal of Solid–State Circuits, vol. 31 (No. 11), p. 1625–1634 (Nov., 1996).

Primary Examiner—Viet Q. Nguyen
Attorney, Agent, or Firm—Duft, Graziano & Forest, P.C.

[57] ABSTRACT

A ferroelectric integrated circuit memory includes a memory cell having a first ferroelectric capacitor, one electrode of which is connected to a first bit line through a first transistor and the other electrode of which is connected to a plate line; and a second ferroelectric capacitor, one electrode of which is connected to a second bit line through a second transistor and the other electrode of which is connected to the plate line. The plate line is parallel to the bit lines. The plate line is at ½ Vdd. The cell is written to by driving both bit lines either to Vdd or zero volts. The cell is read by driving one bit line to Vdd and the other to zero volts, and sensing the voltage change on the plate line. A shunt system holds the isolated node to the same voltage as the plate line when the row is not selected, thus providing a ferroelectric memory architecture that is unaffected by changes, such as aging, in the ferroelectric material, and has no disturb voltages.

15 Claims, 6 Drawing Sheets

FERROELECTRIC MEMORY WITH TWO FERROELECTRIC CAPACITORS IN MEMORY CELL AND METHOD OF OPERATING SAME

BACKGROUND OF THE INVENTION

1. Field of the Invention

The invention in general relates to ferroelectric memory architecture, and more particularly to memory architecture that includes a memory cell with two capacitors and in which the bit lines are driven and the plate line is switched.

2. Statement of the Problem

It is well-known that ferroelectric materials are capable of retaining a polarization which can be used to store information in a non-volatile memory. For example, if a strong enough electric field or voltage is placed across a ferroelectric capacitor, when the voltage is removed, a polarization in the direction of the field remains. If the field is then placed across the same capacitor in the opposite direction, the ferroelectric material switches, and when the field is removed, a polarization in the opposite direction remains. Electronic circuits have been designed to associate the polarization in one direction with a digital logic "1" state, and polarization in the opposite direction with a logic "0" state. See, for example, the circuits described in U.S. Pat. No. 2,876,436 issued on Mar. 3, 1959 to J. R. Anderson. Like other integrated circuit memories, these circuits include memory cells arranged in rows and columns, each memory cell including at least one switch, a capacitor having a pair of plate electrodes, and the memory also including plate lines connected to one plate of the capacitor in each cell, and bit lines connected to the other plate of the capacitor through the switch. In the Anderson patent cited above, the switch is a diode. As known in the art, the switch can be a transistor having a gate, a source and a drain, and the memory includes word lines connected to the control gate of the transistor. The transistor acts as a switch controlled by its gate, to connect the capacitor to the bit line. Information is written into a memory cell by placing either a high or a low voltage on the bit line, turning the transistor on to connect the bit line to the capacitor, and placing a predetermined voltage between the high and low voltage on the plate line. The high voltage causes the memory cell to assume one polarization state, and the low voltage causes the memory cell to assume the opposite polarization state. The memory cell is read by creating a voltage difference between the bit line and plate line, connecting the bit line to the capacitor via the transistor. If the ferroelectric state changes due to the applied voltage, the bit line will assume a first voltage, and if the ferroelectric state does not switch, then the bit line will assume a second voltage. The bit line voltage is compared to a reference voltage that is about half-way between the first and second voltages; if the bit line voltage is below the reference voltage, a sense amp drives an output low, and if the bit line voltage is above the reference voltage, a sense amp drives an output high. In this way, the state of the ferroelectric capacitor prior to reading determines the output state when the cell is read.

In the above-described memory and other similar conventional ferroelectric memories, the plate line is pulsed. The plate line, being relatively long and connected to the electrodes of many capacitors, has a high capacitance. Thus, it takes a relatively long time for the voltage to rise to its full value, with the result that the time to read and write to the memory is long. To speed up the read and write processes, ferroelectric memories in which the plate line is not pulsed have been developed. See U.S. Pat. No. 5,029,128 issued Jul. 2, 1991, to Haruki Toda, and Hiroki Koike et al., "A 60-ns 1-Mb Nonvolatile Ferroelectric Memory With A Nondriven Cell Plate Line Write/Read Scheme, *IEEE Journal of Solid State Circuits*, Vol. 31, No. 11, November 1996. However, these memories have several other problems summarized below.

Up until recently, all ferroelectric materials tended to fatigue over time, and the switching charge decreased to a point where the cell could no longer be read. Recently, a class of materials, called layered superlattice compounds herein, have been discovered that do not fatigue. However, while the switching charge remains relatively stable in these materials, the materials still age, i.e., the magnitude of the first and second voltages generally depends on the history of the memory cell. For example, depending on the history, both the first and second voltages in one reading on a specific cell will differ by some voltage factor from the first and second voltages of a later reading of the same cell; or the hysteresis curve may drift over times in the order of milliseconds due to redistribution of charge within the capacitor. Thus, while the reference voltage will be between the first and second voltages for one reading, in a later reading both the first and second voltages may be above the reference voltage. This generally results in a misreading of the memory cell. Thus, these memories are not "safe" in that the reading or sensing of the data is relatively unreliable.

A typical solution to the above problem is disclosed in U.S. Pat. No. 4,888,733 issued Dec. 19, 1989 to Kenneth J. Mobley. The memory disclosed in the Mobley patent pulses the ferroelectric capacitor in one direction and stores the developed charge on a first temporary storage capacitor, pulses the ferroelectric capacitor in the opposite direction and stores the developed charge on a second temporary storage capacitor, and then compares the stored charges on the two storage capacitors. Thus, this memory essentially compares two states of the same capacitor taken one after the other in a time interval that is too short for aging or other changes to take place. However, this solution triples the length of time it takes to read a memory, thus this memory is not competitive with state-of-the-art memories which require fast read times. Further, the extra temporary storage capacitors are linear capacitors, which take up significant additional room in the memory, so a memory according to the Mobley design is relatively bulky and is not competitive in a memory market where memory chips are increasingly more dense. There are many other multi-capacitor/multi-transistor ferroelectric memories that have been proposed to solve the above problems, some of which have been incorporated into commercial products. All of them are both significantly less dense than conventional DRAMs and are slower.

Ferroelectric memories also are subject to problems relating to the fact that, unlike DRAMS and other memories based on linear capacitance, a "read voltage" must be placed across the ferroelectric memory to read it. Because in all viable memory architectures cells are in arrays, when the read voltage is placed across the selected cell, some non-selected cells also experience a voltage, called a "disturb voltage". This "disturb voltage" can alter the state of the cell and result in an erroneous data state. In architectures in which the plate line is parallel to the bit line, such as the Koike et al. reference, all the capacitors in the same row as the selected cell are connected across their bit and plate lines when the plate line voltage is applied. Thus, a significant disturb voltage of the same order of magnitude of the read voltage is placed across these nonselected cells. For architectures in which the bit line is perpendicular to the plate line, such as in those of the Toda patent, the nonselected capacitors connected to the selected plate line are not connected to their bit lines when the plate voltage is applied. Thus, the disturb voltage is less, but still significant.

The above problems, particularly the aging problem and the "disturb" problem, are most severe in the fastest and densest memory architectures, such as the Koike et al. architecture. Thus, commercial applications of ferroelectric memories have up to now been limited to relatively slow and bulky architectures, such as the Mobley design. It would be highly desirable to have a ferroelectric memory architecture that was faster and less bulky than the Mobley design, yet was not subject to the problems of fatigue and aging. Such a memory design that also avoided the "disturb" voltage problem, would be a significant advance in the art.

3. Solution to the Problem

The present invention solves the above problem by providing a ferroelectric memory architecture that provides safe, reliable sensing while at the same time being as fast or faster than any prior art design.

The present invention solves the above problems by providing a ferroelectric memory having two capacitors and two switches in each memory cell. The cell architecture is arranged so that, when the cell is read, the linear charge from the two capacitors cancels. Further, the architecture insures that any change in the ferroelectric properties due to aging will also cancel out when the cell is read.

An essential aspect of the invention is that the plate and bit lines are parallel and, for a given memory cell, the bit line is driven and the plate line is read. The parallel plate and bit line architecture results in the nonselected capacitors connected to the selected plate line being disconnected from its corresponding bit line when the bit line is driven. Further, since the plate line is read, the voltage change on the plate line is on the order of tens or a few hundred millivolts, rather than on the order of volts as in the prior art architectures in which the plate line is driven. Thus, any disturb voltage is a factor of ten to a hundred times less than that of prior art designs. Since in ferroelectric memories the effect of a disturb voltage drops off non-linearly and at a faster rate than the voltage, errors due to disturb voltages are more than a hundred times less than in prior art memories.

Since the effect of aging is canceled and the effect of disturb voltages is reduced by a factor of a hundred or more, the memories according to the invention are far safer and more reliable than prior art ferroelectric memories.

In the preferred embodiment, there are two bit lines for each plate line, with one of the capacitors in each cell connected to its corresponding bit line through a switch, and the other capacitor in each cell connected to the other bit line. For both capacitors, the electrode not connected to the bit line through the switch is connected to the cell plate line. Preferably, the switch is a transistor, although it can also be a diode or other switch.

The invention provides a ferroelectric integrated circuit memory comprising: a ferroelectric memory cell; a plate line; and a bit line; the plate line parallel to the bit line; the memory cell connected between the plate line and the bit line; a drive circuit for applying a read voltage across the memory cell; and an output circuit providing an output signal representative of the signal on the plate line after the read voltage is placed across the memory cell. Preferably, the bit line comprises a first bit line and a second bit line, and the memory cell comprises a first ferroelectric capacitor, a first switch, a second ferroelectric capacitor and a second switch, the first switch connected to the first bit line and the first ferroelectric capacitor connected between the first switch and the plate line; the second switch connected to the second bit line and the second ferroelectric capacitor connected between the second switch and the plate line. Preferably, the first switch and the second switch are transistors. Preferably, the output circuit includes an output line and plate line amplifier for applying the voltage on the plate line to the output line. Preferably, the drive circuit includes a bit line driver.

In addition, the invention provides a ferroelectric integrated circuit memory comprising: a first bit line and a second bit line; a plate line; and a memory cell comprising: a first ferroelectric capacitor, a second ferroelectric capacitor, a first switch and a second switch; the first switch connected between the first bit line and one electrode of the first ferroelectric capacitor, the second switch connected between the second bit line and one electrode of the second ferroelectric capacitor, and the other electrodes of the first and second capacitors connected to the plate line. Preferably, the memory also includes a word line, the first switch comprises a first transistor having a gate, the second switch comprises a second transistor having a gate, and the word line is connected to the gates of the first and second transistors. Preferably, the first and second ferroelectric capacitors are essentially identical. Preferably, the memory further comprises a shunt system for equalizing the voltage across the first capacitor and equalizing the voltage across the second capacitor when the memory cell is not selected to be read or written to. Preferably, the shunt system comprises a first shunt transistor connected between the node connecting the first transistor and the first capacitor and the plate line, and a second shunt transistor connected between the node connecting the second transistor and the second capacitor and the plate line, and a shunt line connected to the gates of the shunt transistors. Preferably, the shunt line is parallel to the word line. Preferably, the plate line is parallel to the bit lines.

The invention also provides a method of operating a ferroelectric integrated circuit memory of the type comprising a first bit line and a second bit line, a plate line, and a memory cell comprising: a first ferroelectric memory element and a second ferroelectric memory element; a first switch and a second switch, the first switch connected between the first bit line and the first ferroelectric memory element, the second switch connected between the second bit line and the second ferroelectric memory element, the ferroelectric memory elements connected to the plate line; the method comprising the steps of: writing a logic state into the ferroelectric memory elements by driving the first and second bit lines to the same voltage while the switches are connecting the bit lines and the memory elements; and reading the logic state by driving the first and second bit lines to different voltages and sensing a voltage on the plate line. Preferably, the method further comprises the step of electrically shunting the node between the first switch and the ferroelectric memory element and the node between the second switch and the second ferroelectric memory element to the plate line to equalize the voltage across the first ferroelectric memory element and to equalize the voltage across the second ferroelectric memory element when the memory cell is not being written to or read. Preferably, the step of writing comprises driving the first and second bit lines to either the system supply voltage, Vdd, or zero volts while holding the plate line at ½ Vdd. Preferably, the step of reading further comprises placing the plate line at a voltage of ½ Vdd prior to the step of reading. Preferably, the memory further includes an output line, and the step of sensing the voltage on the plate line comprises driving the input line to the same voltage as the plate line and sensing the voltage on the output line.

The invention further provides a method of operating a ferroelectric integrated circuit memory of the type comprising a memory cell comprising: a first ferroelectric element, a second ferroelectric element, and a conducting line, the first and second ferroelectric elements electrically connected to or electrically connectable to the conducting line; the method comprising the steps of: writing a logic state into the ferroelectric memory elements by placing a voltage across them; and reading the logic state by: causing the first ferroelectric element to transfer a first linear charge to the conducting line, causing the second ferroelectric element to transfer a second linear charge to the conducting line, and causing one of the ferroelectric elements to transfer a ferroelectric switching charge to the conducting line, wherein the first linear charge is essentially equal to and opposite in sign to the second linear charge so that the first and second linear charges essentially cancel, and thereafter sensing the voltage on the conducting line. Preferably, the step of causing one of the ferroelectric elements to transfer a ferroelectric switching charge to the conducting line comprises: effecting a transfer of a first ferroelectric switching charge to the conducting line when the ferroelectric elements are in a first polarization state, and effecting a transfer of a second ferroelectric switching charge to the conducting line when the ferroelectric elements are in a second polarization state, wherein the first and second ferroelectric switching charges are of opposite signs so that one causes the voltage on the conducting line to drop and the other causes the voltage on the conducting line to rise.

The invention not only provides a ferroelectric memory that is far safer and more reliable than prior art ferroelectric memories, but it is also especially fast because the plate line is not driven. Numerous other features, objects and advantages of the invention will become apparent from the following description when read in conjunction with the accompanying drawings.

DESCRIPTION OF THE PREFERRED EMBODIMENT

1. Overview

Figure 1:
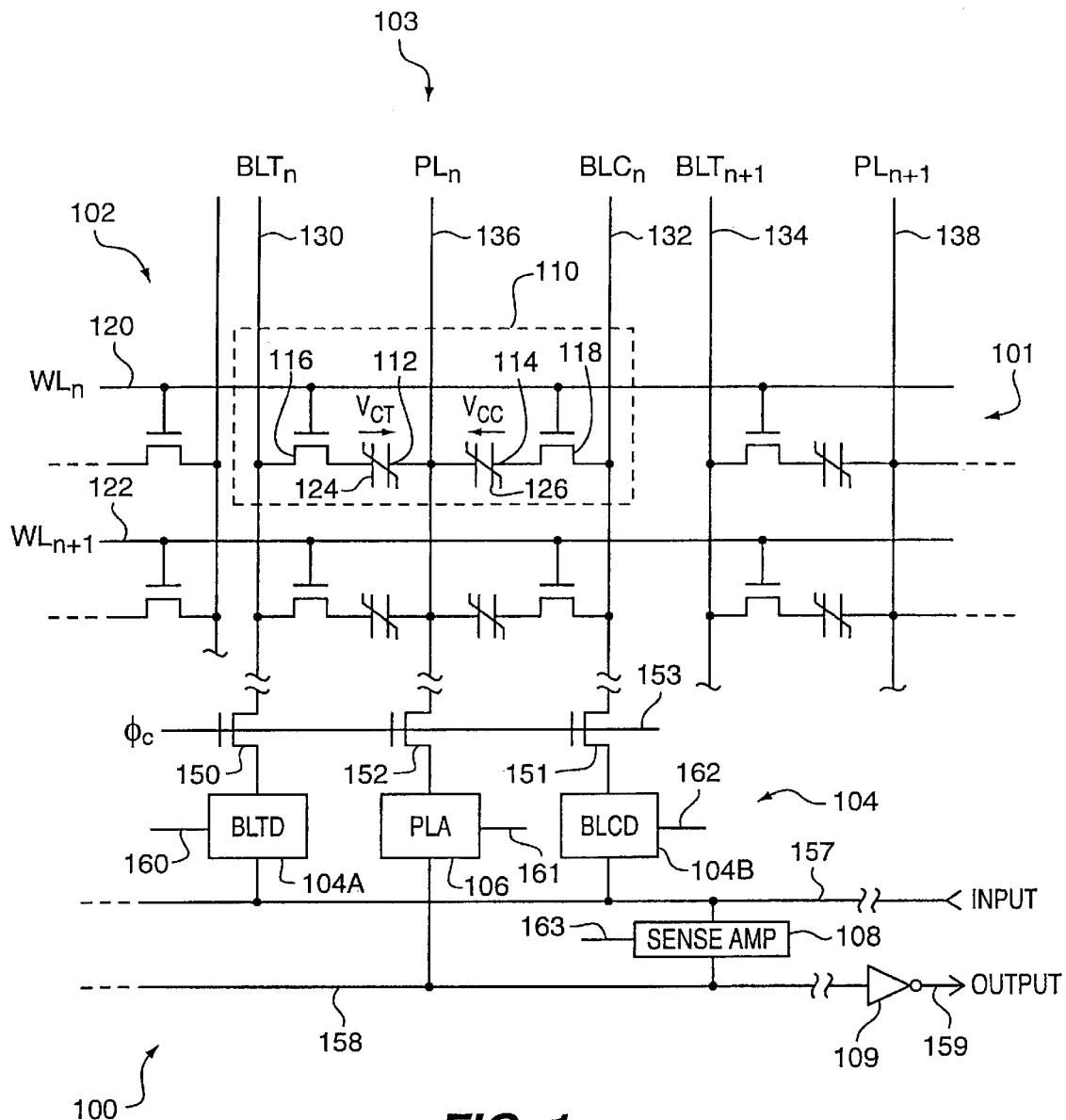
FIG. 1 is a schematic diagram of the preferred embodiment of a memory array according to the invention.
Figure 6:
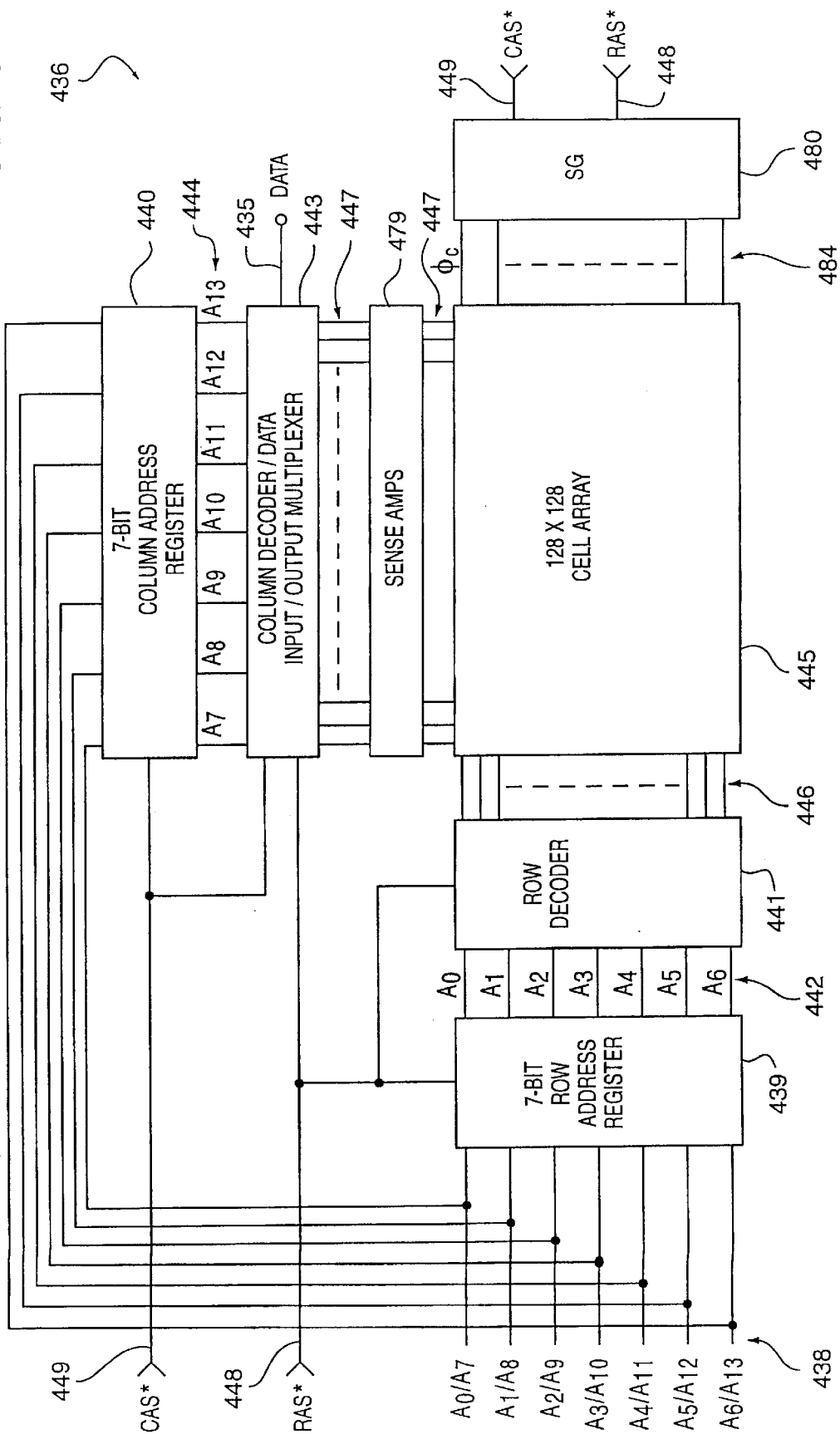
FIG. 6 shows an exemplary embodiment of a memory according to the invention that utilizes the memory arrays of either FIGS. 1 or 4.

Directing attention to FIG. 1, a schematic diagram of a portion 100 of a memory according to the invention is shown. Memory portion 100 includes a memory array 102, a bit line driver circuit 104 having portions 104A and 104B, a plate line amplifier circuit 106, a sense amplifier 108 and an inverter 109. Memory array 102 includes an array of rows, such as 101, and columns, such as 103, of memory cells. A typical memory cell 110, which is the memory cell at the juncture of row 101 and column 103, is shown in detail. Array 102 also includes a plurality of conductors 120, 122, etc., conventionally called word lines; a plurality of conductors 130, 132, 134 etc., conventionally called bit lines; and a plurality of conductors 136, 138 etc., conventionally called plate lines. One word line 120, a pair of bit lines 130, 132, and one plate line 136 are associated with cell 110. Cell 110 comprises ferroelectric capacitors 112 and 114, a first switch 116, and a second switch 118. Switches 116 and 118 are shown as transistors, though they can also be diodes as shown in the Anderson patent cited above, or other electronic switches. One source/drain of transistor 116 is connected to bit line 130 and the other source/drain is connected to one plate of ferroelectric capacitor 112. One source/drain of transistor 118 is connected to bit line 132 and the other source/drain is connected to one plate of ferroelectric capacitor 114. The other plate of each of capacitors 112 and 114 are connected to plate line 136. Word line 120 is connected to the gate of transistor 114, transistor 116, as well as the other transistors in the cells in row 101. Bit line 130 is connected to bit line driver portion 104A through transistor 150, bit line 132 is connected to bit line driver portion 104B through transistor 151, and plate line 136 is connected to plate line amplifier 106 through transistor 152. The gates of transistors 150, 151 and 152 are connected to a conductor 153 carrying signal $\phi_c$. Bit line driver portions 104A and 104B are each connected to input line 157. The output of plate amplifier circuit 106 is connected to output line 158. Sense amplifier 108 is connected between input line 157 and output line 158. Output line 158 provides the input to inverter 109. The output of inverter 109 and input line 157 connect to the memory data input output circuitry 443 (FIG. 6). Lines 160, 161, 162, and 163 connect to bit line driver portion 104A, plate line amplifier 106, bit line driver portion 104B, and sense amplifier 108, respectively, to provide appropriate timing signals to the respective circuits. Each of circuits 104A, 106, 104B, and 108 also have connections to the supply voltage, Vdd, to a voltage source equal to ½ the supply voltage, ½ $V_{dd}$, and the memory ground; since these are known in the art, they are not shown so as not to unduly clutter the drawing.

Memory 100 is written to by placing a voltage Vct across capacitor 112 and a voltage Vcc across capacitor 114 by controlling input line 157, bit line driver 104A and 104B, transistors 116 and 118 and plate line 136, such that the ferroelectric capacitors 114 and 116 assume one of two polarization states: a polarization in the direction from the respective bit line to the plate line, which we shall arbitrarily call the "low" or logic "0" polarization state, or a polarization in a direction away from the plate line and toward the respective bit line, which we shall call the "high" or logic "1" polarization state. The plate line is preferably always at ½ Vdd, thus the logic "1" state is written by driving input 157 and both bit lines 130, 132 high, i.e., to Vdd, while word line 120 is high and transistors 116 and 118 are, therefore, conducting; the logic "0" state is written by driving input 157 and both bit lines 130, 132 to the low state, i.e., zero volts, while word line 120 is high, and, thus, transistor 116 and 118 are conducting. As will be discussed in detail below, memory 100 is read by driving bit lines 130 and 132 to opposite logic states, i.e., driving one "high" and the other "low", while word line 120 is "high"; preferably, bit line 130 is driven to zero volts and bit line 132 to Vdd while word line 120 is "high", which develops a voltage on plate line 136, which determines a voltage on output line 158, which voltage is sensed by sense amplifier 108 to drive the output line to either the logic "1" of logic "0" state, depending on the polarization state of capacitors 112 and 114. In the architecture just described, if capacitors 112 and 114 are in the logic "0" state, output line 158 is driven "high", and if capacitors 112 and 114 are in the logic "1" state, output line 158 is driven "low". Thus, for consistency between the designation of the input and output signals, the signal on output line 158 is inverted before it goes to the memory input/output circuitry 443 (FIG. 6). It should be understood that the invention only depends on the ability to create a pair of readable polarization states on capacitors 116 and 118, and the designation of one or the other as "high" or "low" is arbitrary.

As indicated above, array 102 is made up of a number of rows of word lines and a number of columns of bit lines and plate lines and their associated memory cells. Only the cells in the nth and (n+1)th row and the nth column are shown in full detail, while portions of the cells in the (n−1)th column and the (n+1)th column are shown. As known in the art, other rows exist above and below those shown, and other columns exist to the left and right of those shown, sufficient to provide the desired number of memory cells in the memory array. Each such memory cell is connected as shown for the typical cell 110. As known in the art, each bit line pair is connected to bit line driver pair 104A and 104B through transistors, such as 150 and 151, and each plate line is connected to plate line amplifier 106 through a transistor, such as 152. These transistors 150, 151, and 152 connect the bit line and plate line to bit line driver portions 104A and 104B and plate line amplifier 106 when the specific column of the bit line and plate line is addressed (see discussion in connection with FIG. 6 below.) For example, when the nth column 103 is addressed, $\phi_c$ goes high and transistors 150, 151 and 152 turn on. When some other column is addressed, $\phi_c$ as well as the corresponding signals for all columns except the addressed column are low, and the corresponding signal for the column addressed goes high, and the corresponding transistors for the addressed column turn on. This function of transistors such as 150, to connect electrical lines of an addressed column, such as bit line 130, to an appropriate input or output circuit is known in the art, and will not be discussed further herein.

In the preferred embodiment, a single bit line driver 104 and a single plate line amplifier 106 serves several columns, with transistors 150 and 151 connecting the selected bit line to the bit line driver, and transistor 152 connecting the selected plate line to the plate line driver. The number of columns served by one driver will depend on the size of the array and the capacitance of the lines. However, the invention contemplates that, in some embodiments, a single bit line driver drives all the bit lines, and a single plate line amplifier can serve all the plate lines, or an embodiment may include a bit line driver 104A, 104B for each pair of bit lines and a plate line amplifier 106 for each plate line. In the latter embodiment, transistors 150, 151 and 152 would not be present. Embodiments all along the range between the two foregoing extremes are also contemplated.

As known in the art, a signal on a word line selects the row to be addressed. In particular, the signal on word line 120 determines if row 101 is to be addressed, and selects cell 110 by turning on transistor 114 when row 101 is addressed. If at the same time column 103 is addressed, then cell 110 is the memory cell selected to be either read or written to. When column 103 is addressed, a signal is applied to bit line pair 130 and 132 via bit line driver 104A, 104B to read or write to memory cell 110. The application of a read signal to bit line pair 130, 132 causes a signal to develop on plate line 136, which signal is processed to provide output data on line 158.

Capacitors 112 and 114 are preferably identical, though some variation is permissible, as long as it is not so much as to make the linear charge developed and/or the polarization charge developed by the capacitors so different that the voltage developed on the plate line is not such that can be distinguished as the proper state of the capacitors, as will be discussed below. In the preferred embodiment, the ferroelectric material is a layered superlattice compound, such as described in U.S. Pat. No. 5,519,234, which is hereby incorporated by reference as though fully disclosed herein, though it also may be an $ABO_3$ type ferroelectric material, such as PZT, or other suitable ferroelectric material. Bit line driver 104A, 104B is, preferably, an on-chip circuit that drives the bit lines to provide the voltages shown as $BLT_n$ and $BLC_n$ in FIG. 2 to bit lines 130 and 132, respectively, when column 103 is selected, and provides identical voltages to the other bit line pairs when their column is selected. The design of such a bit line driver is known in the art, and thus will not be discussed further herein. Plate line amplifier 106 is preferably a unity gain amplifier that simply applies a signal of the same voltage as that on plate line 152 to output line 158. Generally, to save power, this amplifier operates only at times at which an output is required, which is determined by the timing signal on line 161. As known in the art, a unity gain amplifier (UGA) is a circuit that, when enabled, drives an amplifier output to the same voltage as the voltage on an amplifier input. Unity gain amplifiers are known in the art, so the details of the circuitry of UGA 106 will not be discussed in detail. Likewise, sense amplifier 108 is an on-chip circuit that is well known in the art, and, thus, its detailed design will not be discussed herein. As known in the art, when enabled, sense amp 108 functions to drive the one of lines 157 and 158 that has a higher voltage to the system "high" voltage, and the one of lines 157 and 158 that has the lower voltage to the system "low" voltage. When a cell is being read, input line 157 is always at the voltage ½ Vdd, and, thus, if the plate line, and thus output line 158, is higher than ½ Vdd when the sense amplifier is enabled, sense amplifier 108 drives the input line to the system "low" voltage, preferably zero volts, while driving the output line to the system "high" voltage, which preferably is Vdd. If, however, the plate line is lower than ½ Vdd when the memory is read, then, when the sense amplifier is enabled, it drives the input line to the system "high" voltage and the output line to the system "low" voltage.

Figure 2:
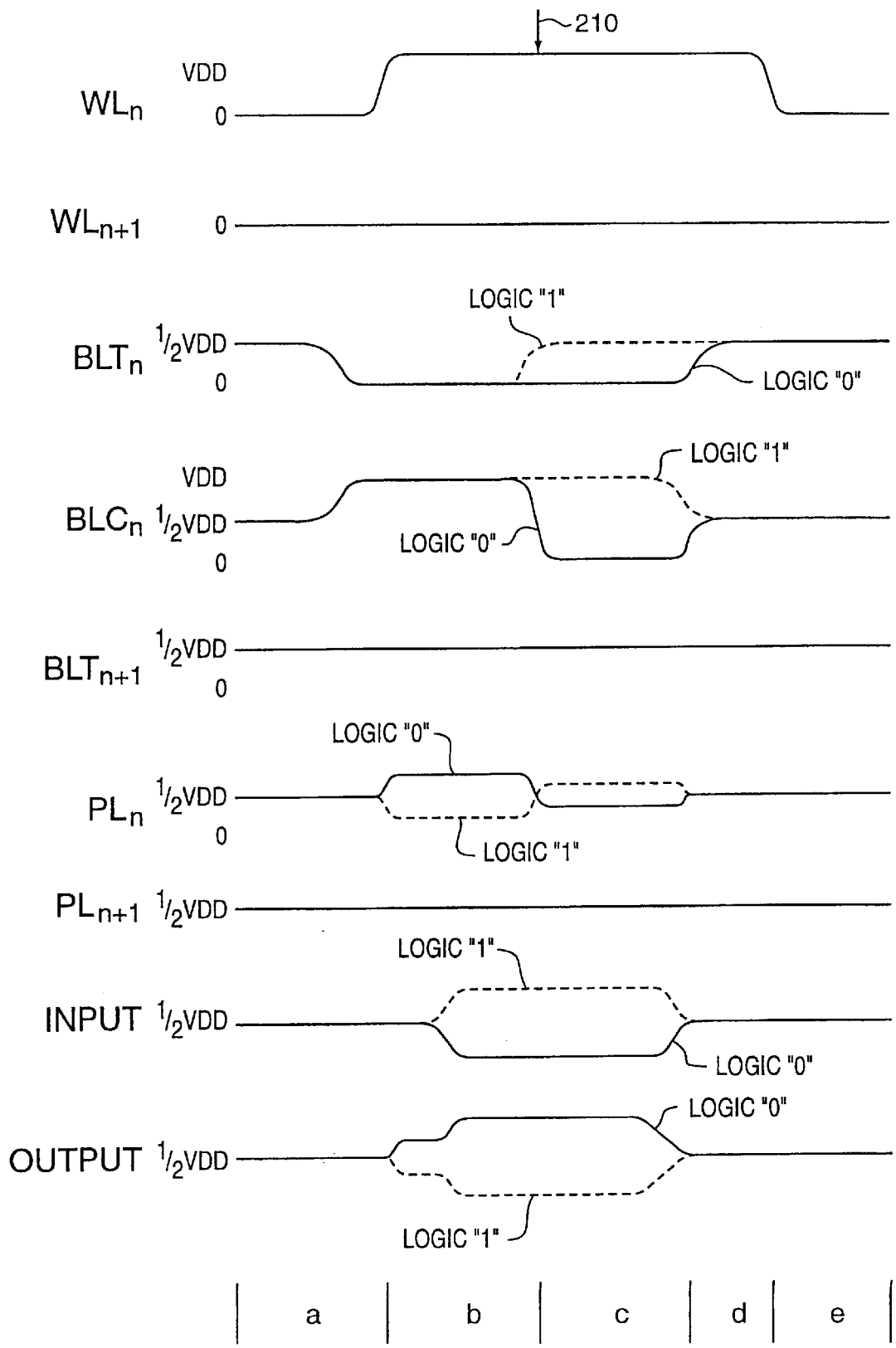
FIG. 2 shows the preferred embodiment of a timing diagram for the memory of FIG. 1.

Turning now to FIG. 2, the detailed operation of memory portion 100 according to the invention will now be described for the typical memory cell 110. FIG. 2 shows a graph of voltage in volts versus time in nanoseconds for the various voltages applied to and developed in the circuit of FIG. 1 in a read/rewrite cycle, which is conventionally known as a timing diagram. As is conventional for timing diagrams, the information is presented in a qualitative form to illustrate the relative points in time of the various operations, and, thus, the values along the time scale are not given. Prior to the beginning of the cycle, all the bit lines and plate lines in memory array 102, including $BLT_n$, $BLC_n$, and $PL_n$, are at ½ Vdd, that is, half the supply voltage. Thus, there is no external field across either ferroelectric capacitor 112 or ferroelectric capacitor 114; that is, Vct and Vcc are zero. Both input line 157 and output line 158 are at ½ Vdd, which is the nominal reference voltage supplied to sense amp 108. For the purpose of discussion, it is assumed that capacitors 112 and 114 are in the logic "0" state; that is, they are polarized in the direction of plate line 136. The read cycle begins with bit line 130 being driven to zero volts by bit line driver 104A and bit line 132 being driven to Vdd by bit line driver 104B, in response to timing signals on lines 160 and 162, respectively. Shortly after the bit line voltages change, $WL_n$, the word line 120 voltage, goes to 1.5 Vdd. However, it should be noted that the word line can go high before or while the bit line voltage changes, without affecting the operation of the memory. The 1.5 Vdd voltage on the gates of transistors 116 and 118 turns the transistors on; the fact that the voltage is higher than Vdd, i.e., it is boosted, permits transistor 118 to pass essentially the full bit line voltage to electrode 126 of capacitor 114. When the voltage on electrode 124 falls to zero volts, the plate line is still at ½ Vdd, so a voltage Vct is applied across capacitor 112. Put in terms of electric field, an electric field in the direction of the arrow under Vct is applied across the ferroelectric material in capacitor 112. This field is the same as the direction of the polarization of capacitor 112, so the capacitor does not switch. When the voltage on electrode 126 rises to Vdd, the plate line is still at ½ Vdd, so a voltage Vcc is applied across capacitor 114. Put in terms of electric field, an electric field in the direction opposite the arrow under Vcc is applied across the ferroelectric material in capacitor 114. This field is opposite to the direction of the polarization of capacitor 114, so the capacitor switches.

When the electric fields are placed across capacitors 112 and 114, a linear charge proportional to the linear capacitance of the capacitors flows to plate line 136. Since the plate line is at a higher potential than one bit line and at a lower potential than the other bit line, the charges due to each capacitor are of opposite signs. Since the capacitors 112 and 114 are essentially identical, and the voltages across them are essentially the same, the linear charges are equal and opposite and cancel. There will be an additional charge flowing from the capacitor that switched, i.e., the polarization switching charge of capacitor 114. Since bit line 132 is at a higher voltage than the plate line, this polarization switching charge will cause the voltage on the plate line 136 to rise above ½ Vdd. This voltage higher than ½ Vdd is applied to output line 158 via plate line amplifier 106. Sense amplifier 108 is then enabled in response to a timing signal on line 163. Since input line 157 is at ½ Vdd, sense amplifier 108 drives output line 158 to the "high" voltage, which is inverted by inverter 109 to provide a "low" data signal to the output circuitry.

At this time, indicated by arrow 210 in FIG. 2, the rewrite portion of the cycle begins. The "low" data signal on the output tells the system that capacitors 112 and 114 were in the logic "0" state. This state was destroyed in one of the capacitors by the read process. The system then drives both bit lines to zero volts to rewrite the logic "0" state back into both capacitors. The switching of capacitor 114 causes plate line 136, i.e., the $PL_n$ signal, to rise a little above ½ Vdd, but by this time the timing signals to plate line amplifier 106 and sense amplifier 108 via lines 161 and 163 have disabled them, so this change in voltage of the plate line is not transferred to output line 158. Note also that the amount that the $PL_n$ signal rises above ½ Vdd (or falls below ½ Vdd if the capacitors are in the logic "1" state) is less than shown in the drawing; that is, the drawing is merely qualitative, and the constraints of making the drawing legible have affected the relative sizes of the various portions. Alternatively, plate line amplifier 106 can be allowed to drive output line 158 back to nearly ½ Vdd. At the end of the rewrite cycle, both bit lines and the plate line and the input and output lines are returned to ½ Vdd, and then the word line signal $WL_n$ is returned to zero to turn off transistors 116 and 118.

Optionally, instead of rewriting the capacitors back to their original state, a write cycle can begin at point 210. In this case, the memory circuitry responds to a new data signal addressed to cell 110 to cause both plate line amplifier 106 and sense amplifier 108 to be disabled, and the data input/output circuitry 443 (FIG. 6) drives the input line either "high" or "low" depending on whether the new data state is a logic "1" or a logic "0". Bit line drivers 104A and 104B are enabled by the timing signals on lines 160 and 162, respectively, to drive bit lines 132 and 134 to the same logic state. This writes the logic state to capacitors 112 and 114.

If capacitors 112 and 114 are in a logic "1" state prior to the beginning of the read cycle, they are polarized in a direction away from plate line 136. Thus, when bit line 130 goes to zero volts and bit line 132 goes to Vdd, capacitor 112 switches and capacitor 114 does not switch, causing the plate line voltage, $PL_n$, to drop below ½ Vdd, as shown by the dotted line in FIG. 2. Therefore, output line 158 is first driven to below ½ Vdd by plate line amplifier 106, and then to zero volts by sense amplifier 108, in response to the timing signals applied via lines 161 and 163, respectively. A "high" signal is then applied to input/output circuit 443 by inverter 109. The system then rewrites the logic "1" state back to capacitors 112 and 114 by driving both $BLT_n$ and $BLC_n$ "high" as shown by the dotted lines in FIG. 2, and then returns $BLT_n$, $BLC_n$, and $PL_n$ to ½ Vdd as before.

Figure 3:
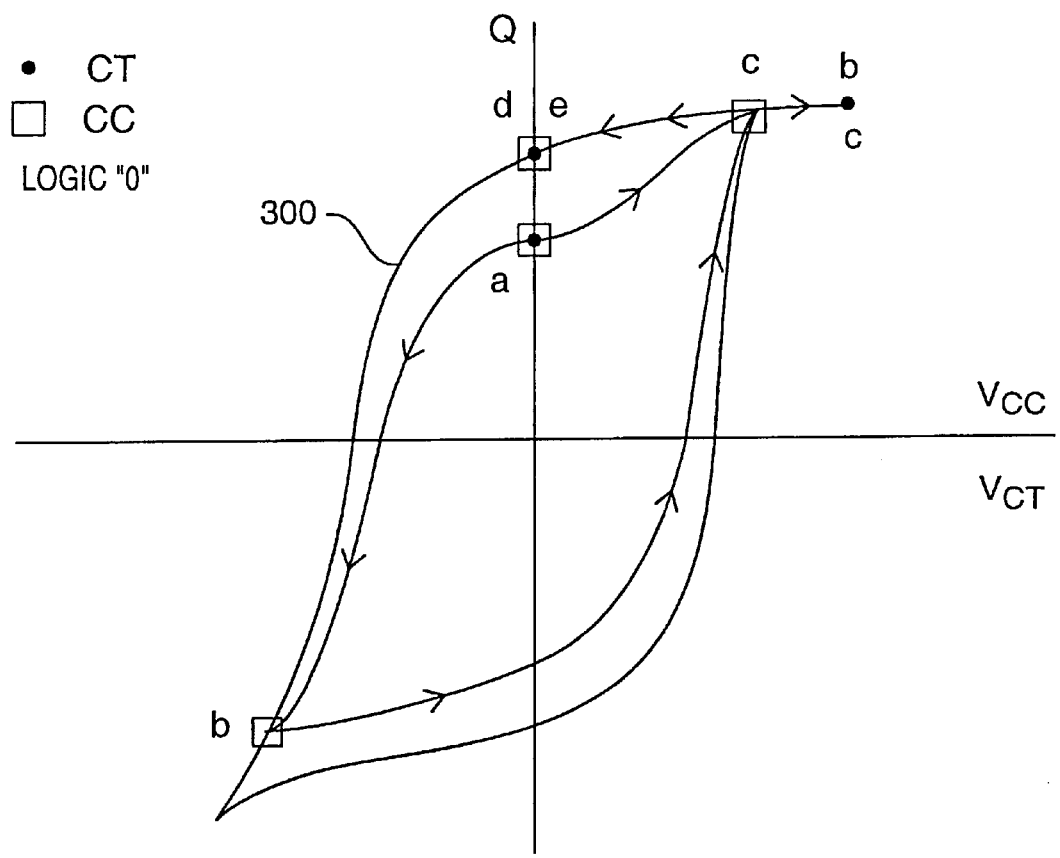
FIG. 3 shows an exemplary hysteresis diagram for a typical ferroelectric capacitor utilized in the memory of FIG. 1 which illustrates the state of the ferroelectric capacitor at various times in the timing diagram of FIG. 2.

We now turn to FIG. 3 and a discussion of the voltages applied and developed across ferroelectric capacitors 112 and 114 and the charges created by those voltages. The voltage versus polarization curve 300 is the hysteresis curve for ferroelectric capacitors 112, 114 which originally are polarized in the direction of the arrows under the Vct and Vcc symbols in FIG. 1, that is, in the logic "0" state. The dots represent the polarization states assumed by capacitor 112, the capacitor that is driven by bit line 130, and the boxes represent the polarization states assumed by capacitor 114, the capacitor that is driven by bit line 132. The letters "a", "b", "c", "d", and "e", represent the time segments with the corresponding letters in FIG. 2. For example, during the time segment "a" in FIG. 2, capacitor 112 (ct) will be in the state indicated by the dot in FIG. 3. As conventional in the art for such hysteresis curves, the number scale is not given since the curve is intended to represent only a qualitative representation of the various points on the qualitative curves of FIG. 3. The x-axis is a voltage scale with units in volts, and the y-axis is a polarization scale with the units in micro coulombs per centimeter squared ($\mu$coulombs/cm$^2$). As can be seen from FIGS. 1 and 3, a polarization in the direction of the arrows in FIG. 1, i.e., the direction toward plate line 136, is taken to be a positive polarization, and a voltage or electric field in that direction is also taken to be a positive voltage or electric field. As will be seen in detail below, the reason there are "two" hysteresis curves is that after a time long compared to the cycle time, the ferroelectric material relaxes to a lower polarization state; thus, the capacitors are assumed to start from this relaxed state. At point "a", there is no external applied voltage on either capacitor 112 or capacitor 114, i.e., Vct and Vcc are zero, and the capacitors have a positive polarization charge. Note that the polarization is not as high as the polarization reached later in the cycle, because it is assumed that at least a few milliseconds has elapsed since the polarization state was entered, and in such a case the ferroelectric will have relaxed to the lower polarization state. The memory operation does not require that the initial state be a relaxed one. The architecture enables a true reading to take place from any initial state; it simply is selected as the initial state because it is most likely that the initial state will be a relaxed one.

The voltage applied to capacitor 112 during the "b" segment of the time scale of FIG. 2 is a positive voltage; thus, the polarization moves up the hysteresis curve in a positive direction, as far as it can go. In segment "b", this positive voltage remains on the capacitor. In segment "c", the same state is rewritten to the capacitor, so it stays at the same point. In segment "d", the voltages on each plate of capacitor 112 are equalized, and so the state returns down the hysteresis curve to the zero voltage state shown at "d", and remains there in segment "e", since the turning off of the transistor does not change the voltage across the capacitor, at least immediately. (But see the discussion of the shunted version of the invention shown in FIG. 4.) The initial voltage applied to capacitor 114 is also zero, and it also is in a state defined as a "positive" polarization state, so capacitor 114 is at the same point of the hysteresis curve in the "a" time segment as capacitor 112. However, the voltage applied to capacitor 114 in the "b" time segment is a negative voltage, which causes the capacitor to switch and go to the state indicated by the box and the "b". In time segment "c", capacitor 114 is rewritten by placing a voltage across it in the positive direction. It goes to the point indicated by the box and segment "c". The voltage across the capacitor in this state is not quite as high as the voltage across capacitor 112 because the plate line is slightly above ½ Vdd, as indicated in FIG. 2. In the "d" time segment, the voltage is removed, since both bit line 132 and plate line 136 return to ½ Vdd; thus, the polarization relaxes down the hysteresis curve to the point "d", and stays there during time segment "e". If the capacitors are not read again for a time on the order of milliseconds, the capacitors will relax back to the point indicated by segment "a".

The hysteresis curve for ferroelectric capacitors 112, 114 which originally is polarized in the direction opposite to the direction of the arrows under the Vct and Vcc symbols in FIG. 1, that is, in the logic "1" state, is complementary to curve 300.

Figure 4:
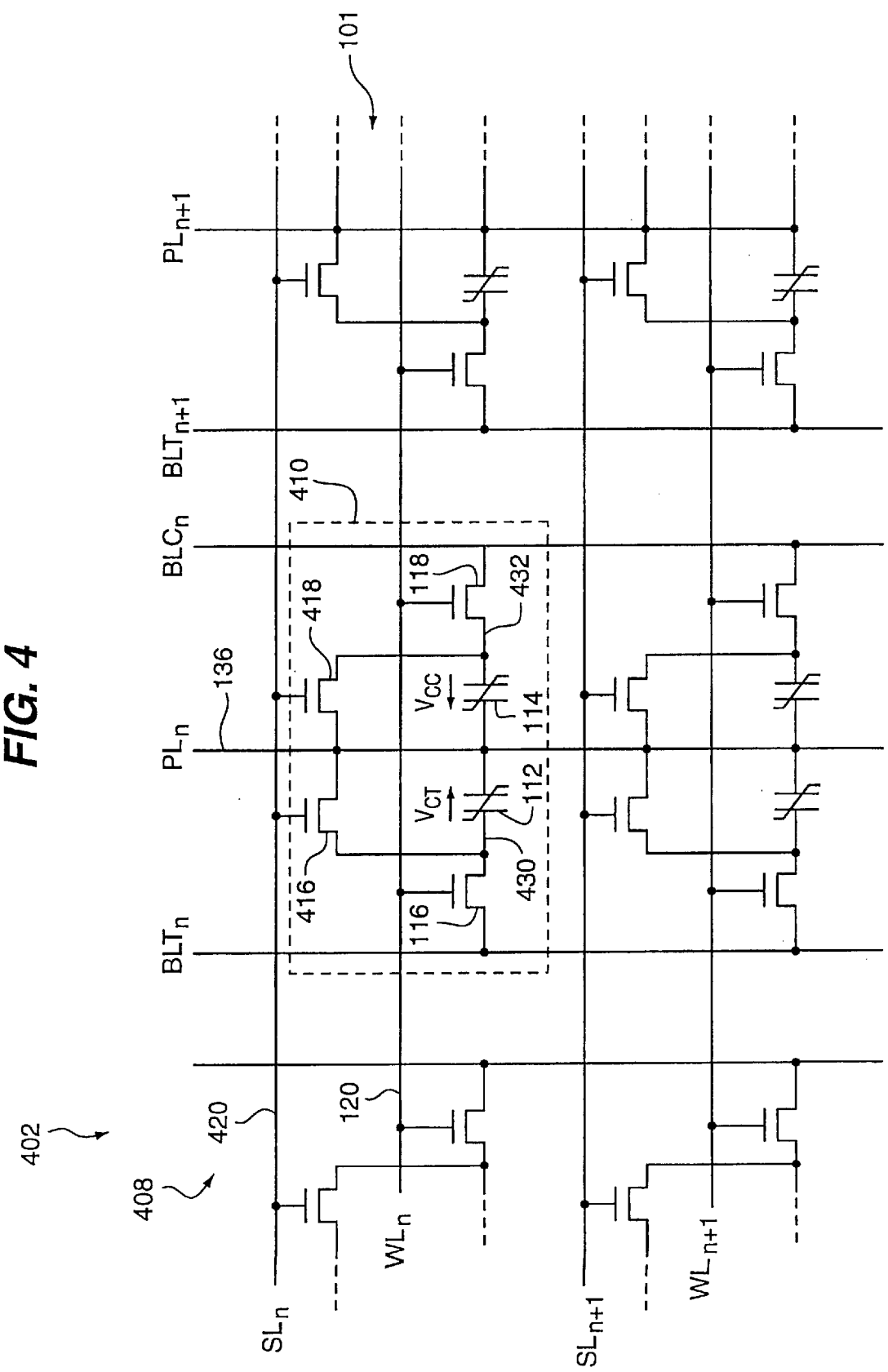
FIG. 4 shows an alternative memory array according to the invention in which the nodes between the ferroelectric capacitors and their corresponding transistors are shunted to the plate line.

FIG. 4 shows an alternative embodiment of an array 402 according to the invention which includes a shunt system 408. This embodiment is exactly the same as the embodiment of FIG. 1, except for the shunt system 408; that is, each row includes a shunt line 420, and memory cell 410 includes shunt transistors 416 and 418. For simplicity, the portions of array 402 that are the same as array 102 are identified by the same numerals. Shunt line 420 is a conductor parallel to word line 120. Shunt line 420 connects to the gates of transistors 416 and 418 of cell 410 as well as the gates of the corresponding transistors in the other memory cells in row 101. Node 430 between transistor 116 and capacitor 112 and node 432 between transistor 118 and capacitor 114 are conventionally called "isolated nodes" in the art, because when transistors 116 and 118, respectively, are off, these nodes are electrically isolated from the rest of the circuit. These isolated nodes can take on a voltage different than ½ Vdd when the adjacent transistor is off, due to leakage from other parts of the circuit. Transistor 416 is connected between isolated node 430 and plate line 136, and transistor 418 is connected between isolated node 432 and plate line 136. Transistors 416 and 418, when full on, provide a short circuit or shunt between nodes 430 and 432, respectively, and plate line 136, and thus prevent Vct and Vcc from becoming non-zero. Transistors 416 and 418 are on whenever row 101 is not selected. Thus, they prevent even the slightest disturb from occurring to capacitors 112 and 114 when row 101 is not selected.

Figure 5:
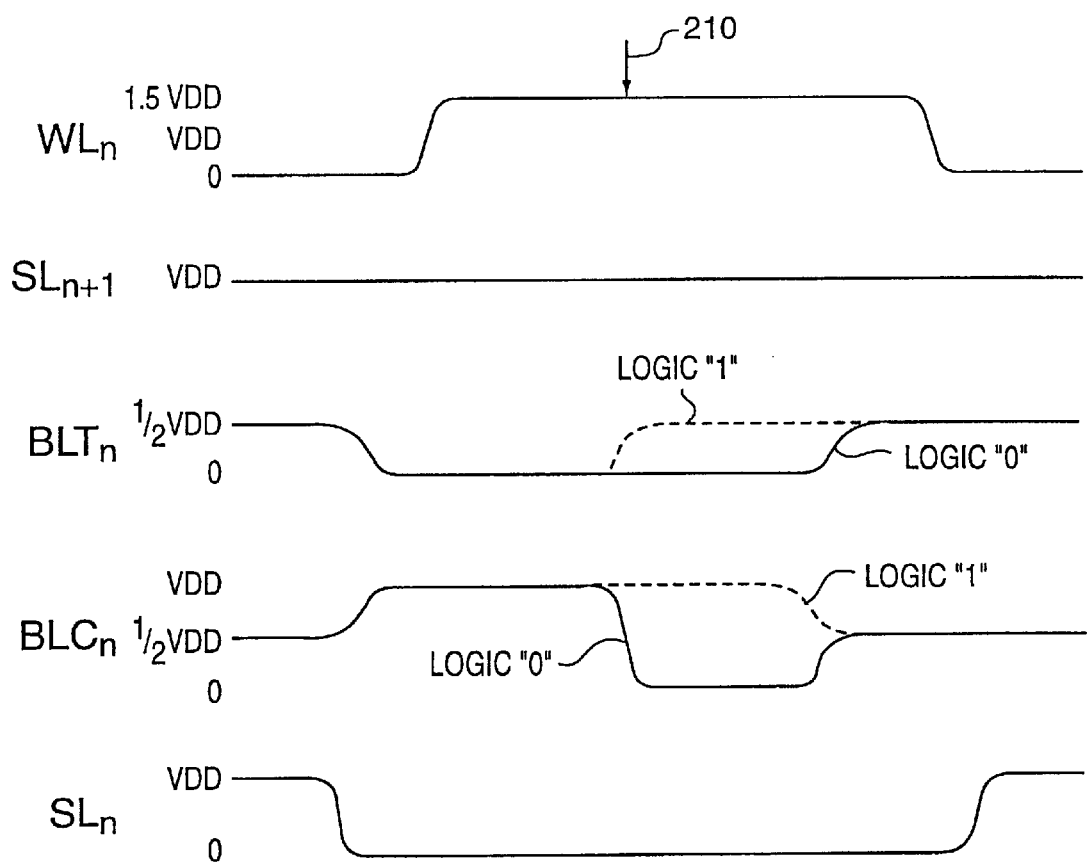
FIG. 5 shows the preferred embodiment of a timing diagram for the memory of FIG. 4.

The timing diagram for the array of FIG. 4 is shown in FIG. 5. This timing diagram is exactly the same as the timing diagram of FIG. 2, except that it includes the $SL_n$. Of the signals shown in FIG. 2, only $WL_n$, $BLT_n$, and $BLC_n$ are shown in FIG. 5 to provide a comparison to $SL_n$ and $SL_{n+1}$. The other signals shown in FIG. 2 are exactly the same as in that figure. As can be seen from FIG. 4, the $SL_n$ signal is high before the start of the cycle. It may be boosted to 1.5 Vdd, if desired, but this is not necessary here because the transistor only needs to pass a voltage of ½ Vdd. To start the cycle, $SL_n$ drops to zero, which turns off transistors 416 and 418. The rest of the cycle remains the same, until after the word line signal, $WL_n$, drops. After $WL_n$ drops, $SL_n$ comes back up to Vdd, to end the cycle. $SL_{n+1}$, the shunt line signal for the (n+1)th row, as well as the shunt line signals for the other rows, stays at Vdd throughout the cycle for cell 410. A complete disclosure of the design and function of a shunt system is found in U.S. Pat. No. 5,959,878 issued Sep. 28, 1999 to David A. Kamp, which patent is hereby incorporated by reference as though fully disclosed herein.

FIGS. 4 and 5 and the discussion above is just one example of how a shunt system can be incorporated into the memory according to the invention. Many other shunt architectures are possible, such as those shown in U.S. Pat. No. 5,959,878 referenced above.

The invention also contemplates that the plate line can be driven and the data signal is developed on the bit line. In this embodiment the plate line is connected to a plate line driver, and the bit line is connected to a UGA.

The above discussion was in terms of an open bit line architecture. The invention can also be used with a folded bit/plate architecture, and in some cases this is preferred, since, as known in the art, the folded architecture results in lower noise.

FIG. 6 is a block diagram illustrating an exemplary integrated circuit memory 436 in which memory portion 100 is a part, and in which memory arrays, such as 402, according to the invention are utilized. For simplicity, the embodiment shown is for a 16K×1 FeRAM; however, the material may be utilized in a wide variety of sizes and types of memories. In the 16K embodiment shown, there are seven address input lines 438 which connect to a row address register 439 and a column address register 440. Row address register 439 is connected to row decoder 441 via seven lines 442, and column address register 440 is connected to a column decoder/data input/output multiplexer 443 via seven lines 444. Row decoder 441 is connected to a 128×128 memory cell array 445 via 128 lines 446, and the column decoder/data input/output multiplexer 443 is connected to sense amplifiers 479 and memory cell array 445 via 128 lines 447. A signal generator 480 is connected to array 445 via lines 484. These lines provide the $\phi_c$ signal as well as the other timing signals to bit line driver portions 104A and 104B, plate line amplifier 106, sense amplifier 108, as well as the signals to plate line 136, the signals on the shunt lines such as 420, and other signals discussed above. The number of lines depends on which embodiment of the invention discussed above is utilized, as well as the size of the array. A RAS* signal line 448 is connected to row address register 439, row decoder 441, column decoder/data input/output multiplexer 443, and signal generator 480, while a CAS* signal line 449 is connected to column address register 440, column decoder/data input/output multiplexer 443, and signal generator 480. (In the discussion herein, a indicates the inverse of a signal.) An input/output data line 435 is connected to the column decoder/data input/output multiplexer 443. Memory cell array 445 contains 128×128=16,384 memory cells, which is conventionally designated as 16K. These cells are ferroelectric switching capacitor-based cells such as 110. The lines 446 are the word lines, such as 136. The lines 447 are the input and output lines, such as 157 and 159.

The operation of the memory in FIG. 6 is as follows. Row address signals $A_0$ through $A_6$ and column address signals $A_7$ through $A_{13}$ placed on lines 438 are multiplexed by address registers 439, 440 utilizing the RAS* and CAS* signals, and passed to row decoder 441 and column decoder/data input/output multiplexer 443, respectively. Row decoder 441 places the word line signals, such as the $WL_n$ signals discussed above, on one of word lines 446; generally, a signal is placed on the word line of the cell that is addressed. Column decoder/data input/output multiplexer 443 either places the data signal which is input on line 435 on the one of the input lines 447 corresponding to the column address, or outputs on data line 435 the signal on the one of the output lines 447 corresponding to the column address, depending on whether the function is a write or read function. As is known in the art, the read function is triggered when the RAS* signal precedes the CAS* signal, and the write function is triggered when the CAS* signal comes before the RAS* signal. Sense amplifiers 479, one of which is sense amplifier 108, are located along lines 447 to amplify the signals on the lines. The shunt line and plate line signals, such as $SL_n$ and $PL_n$ signals discussed above, are produced by signal generator 480 based on the CAS* and RAS* signals and an internal chip clock. In some memories, signal generator 480 and row decoder 441 may be combined into a single signal generation unit. The circuitry of row decoder 441, column decoder 443, and signal generator 480 is known in the art of integrated circuit memory design, and will not be further discussed herein. Other logic required or useful to carry out the functions outlined above, as well as other known memory functions, is also included in memory 436 but is not shown or discussed as it is not directly applicable to the invention.

As shown in the discussion above, the effect of the linear capacitance naturally falls out as a factor in the operation of the memory as a result of the architecture according to the invention. Unlike other ferroelectric memories, only the switching charge alters the voltage of the sensed line, i.e., plate line 136, and thus this voltage due to the switching charge is easier to sense. Perhaps more importantly, since the two capacitors 112 and 114 are essentially identical, they age essentially identically. Thus, the effects of aging and other effects that depend on the history of the capacitors, such as hysteresis shifting, also cancel out.

Since the bit lines and plate lines are parallel in the architecture of the memory according to the invention, most of the disturb situations of prior ferroelectric memories, and all the serious disturb situations, are eliminated. Since the bit lines and their corresponding plate lines are all held at the same voltage when their column is not selected, there is much less chance of a disturb in the memory architecture according to the invention as compared to prior art ferroelectric memories. This column-not-selected voltage may be ½ Vdd, as discussed above, or, to save power, it may be zero volts. In the design of FIG. 1, there is a small disturb to cells in other rows of the column selected due to the voltage that develops on the plate line. However, this voltage is relatively small, and occurs for only a fraction of the cycle; thus, it is a very small disturb. Moreover, in designs such as that of FIG. 4 which include a shunt system, even this small disturb is entirely eliminated. Thus, for the first time, the memory according to the invention provides a ferroelectric memory that has no disturb and is unaffected by changes in the ferroelectric material over time.

The architecture of the memory according to the invention is somewhat more dense than a pure 1T/1C (one transistor/one capacitor) ferroelectric memory, i.e., a ferroelectric memory which is essentially identical in architecture to the simplest DRAM architecture. However, in actual practice, there are no commercially useful pure 1T/1C ferroelectric designs. All practical ferroelectric 1T/1C designs utilize some additional circuitry to avoid the problems discussed in the background of the invention. The architecture of the memory according to the invention is significantly denser than the architecture of the Mobley et al. design discussed above, which uses a ferroelectric capacitor, two linear capacitors and many transistors. Since a ferroelectric capacitor can be made smaller than a linear capacitor, and since one additional transistor per cell takes up little room on an integrated circuit layout, the memory according to the invention is only a little less dense than a conventional pure 1T/1C DRAM.

A feature of the invention is that the length of a cycle is essentially the same as the cycle of a pure 1T/1C FeRAM. Since practical 1T/1C ferroelectric memory designs use some extension of the cycle to overcome the disturbs and other shortcomings described above, such as a refresh cycle, the memory according to the invention is significantly faster than practical 1T/1C ferroelectric memory designs. Moreover, since a refresh cycle is needed in conventional DRAMS, and ferroelectric capacitors can switch faster than a conventional DRAM capacitor can be written to or read, the memory according to the invention provides a ferroelectric memory that has performance superior to a state-of-the-art DRAM. The memory according to the invention also provides faster access than other 2T/2C (two transistor/two capacitor) ferroelectric memory designs. Thus, in summary, the invention provides a memory that is superior to a conventional DRAM in performance, and only a little less dense than a conventional DRAM, and which at the same time is non-volatile. Moreover, with state-of-the-art ferroelectric materials, such as layered superlattice materials, the ferroelectric memory according to the invention can operate at lower power than conventional DRAMS.

Although the invention has been described in terms of a memory array in which there are two bit lines and one plate line associated with each memory cell, a memory cell in which the ferroelectric elements are capacitors, and in which there is a transistor connecting each capacitor in the memory cell with one of the bit lines, the invention can also be implemented in many other ways. For example, the invention can be implemented with two plate lines associated with each cell and one bit line. In this case, the plate lines will be driven and the bit line sensed. The ferroelectric memory element can be a ferroelectric FET as described, for example, in U.S. Pat. No. 5,523,964 issued Jun. 4, 1996, to Larry D. McMillan et al., which is hereby incorporated by reference as though fully disclosed herein. As known in the art, a transistor is an electronic switch, and thus other electronic switches, such as a diode, can be used. The key feature of the invention is that two ferroelectric elements are arranged so that they connect to a single line, and when they are read, their linear charge, that is, the charge due to their linear capacitances, essentially cancel. Other constant factors, such as the effects of aging, will also cancel. Here "constant factors" means quantities that do not depend on the polarization state, and are thus constant during a cycle. Further, the two capacitors and single (plate or bit) line are arranged so that when the capacitors are in a first polarization state, the line voltage changes in one direction; and when the capacitors are in a second polarization state, the line voltage changes in the other direction. This feature permits the line to be much more easily read as compared to ferroelectric memories in which the two polarization states change the voltage of, say, a bit line, by different amounts but in the same direction.

There has been described a novel ferroelectric memory that is insensitive to changes in the ferroelectric state over time, and at the same time is fast and relatively dense. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiments described, without departing from the inventive concepts. For example, now that the advantage of using a pair of ferroelectric capacitors to cancel out the linear charge effect as well as aging and other effects common to ferroelectric materials has been disclosed, other methods and apparatus for doing the same can be substituted. It is also evident that the signals discussed may in some instances occur in a different order; or equivalent structures and processes may be substituted for the various structures and processes described; or a variety of different circuits and ferroelectric materials may be used. Consequently, the invention is to be construed as embracing each and every novel feature and novel combination of features present in and/or possessed by the ferroelectric memory and the read and write processes described herein.

What is claimed is:

1. A ferroelectric integrated circuit memory comprising a ferroelectric memory cell, a plate line, and a first bit line, said plate line parallel to said bit line, said memory cell connected between said plate line and said bit line;

a drive circuit for applying a read voltage across said memory cell; and an output circuit providing an output signal representative of the signal on said plate line after said read voltage is placed across said memory cell.

2. A ferroelectric memory as in claim 1 and further comprising a second bit line, and said memory cell comprises a first ferroelectric capacitor, a first switch, a second ferroelectric capacitor and a second switch, said first switch connected to said first bit line and said first ferroelectric capacitor connected between said first switch and said plate line, said second switch connected to said second bit line and said second ferroelectric capacitor connected between said second switch and said plate line.

3. A ferroelectric integrated circuit memory as in claim 1 wherein said output circuit includes an output line and plate line amplifier for applying the voltage on said plate line to said output line.

4. A ferroelectric integrated circuit memory as in claim 1 wherein said drive circuit includes a bit line driver.

5. A ferroelectric integrated circuit memory as in claim 1 wherein said switch is a transistor.

6. A ferroelectric integrated circuit memory comprising:

a first bit line and a second bit line;

a plate line;

a memory cell comprising: a first ferroelectric capacitor, a second ferroelectric capacitor, a first switch and a second switch; said first switch connected between said first bit line and one electrode of said first ferroelectric capacitor, said second switch connected between said second bit line and one electrode of said second ferroelectric capacitor, the other electrodes of said first and second capacitors connected to said plate line;

a drive circuit for applying a read voltage across said memory cell; and an output circuit providing an output signal representative of the signal on said plate line after said read voltage is placed across said memory cell.

7. A ferroelectric integrated circuit memory as in claim 6 wherein said memory includes a word line, said first switch is a first transistor, said second switch is a second transistor, and said word line is connected to the gates of said first and second transistors.

8. A ferroelectric integrated circuit memory as in claim 6 wherein said first and second ferroelectric capacitors are essentially identical.

9. A ferroelectric integrated circuit memory as in claim 6 wherein said output circuit includes an output line and plate line amplifier for applying the voltage on said plate line to said output line.

10. A ferroelectric integrated circuit memory as in claim 9 wherein said drive circuit includes a bit line driver.

11. A ferroelectric integrated circuit memory as in claim 6 and further comprising a shunt system for equalizing the voltage across said first capacitor and equalizing said voltage across said second capacitor when said memory cell is not selected to be read or written to.

12. A ferroelectric integrated circuit memory as in claim 11 wherein said shunt system comprises a first shunt transistor connected between the node connecting said first switch and said first capacitor and said plate line, and a second shunt transistor connected between the node connecting said second switch and said second capacitor and said plate line, and a shunt line connected to the gates of said shunt transistors.

13. A ferroelectric integrated circuit memory as in claim 11 wherein said shunt line is parallel to said word line.

14. A ferroelectric integrated circuit memory as in claim 6 wherein said plate line is parallel to said bit lines.

15. A method of reading a ferroelectric integrated circuit memory of the type comprising a bit line, a plate line, and a memory cell connected between said bit line and plate line, said bit line being parallel to said plate line, said method comprising the steps of:

applying a read voltage across said memory cell; and providing an output signal representative of the signal on said plate line after said read voltage is placed across said memory cell.

* * * * *